United States Patent
Yang et al.

(10) Patent No.: US 9,164,522 B2
(45) Date of Patent: Oct. 20, 2015

(54) WAKE UP BIAS CIRCUIT AND METHOD OF USING THE SAME

(71) Applicant: TAIWAN SEMICONDUCTOR MANUFACTURING COMPANY, LTD., Hsinchu (TW)

(72) Inventors: Jung-Ping Yang, Jui-bei (TW); I-Han Huang, Tainan (TW); Chia-En Huang, Xinfeng Township (TW); Fu-An Wu, Hsinchu (TW); Chih-Chieh Chiu, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/051,681

(22) Filed: Oct. 11, 2013

(65) Prior Publication Data
US 2015/0102853 A1    Apr. 16, 2015

(51) Int. Cl.
*H03B 1/00* (2006.01)
*H03K 5/00* (2006.01)
*H04B 1/10* (2006.01)
*G05F 1/46* (2006.01)

(52) U.S. Cl.
CPC ........................ *G05F 1/46* (2013.01)

(58) Field of Classification Search
CPC ..... H03K 19/0016; G06F 1/3203; G06F 1/32; G06F 1/3296; G11C 5/147
USPC ................. 327/427, 434, 108, 544, 530, 538; 326/33, 34
See application file for complete search history.

(56) References Cited

U.S. PATENT DOCUMENTS

| | | | | |
|---|---|---|---|---|
| 7,075,355 B2 * | 7/2006 | Furuie et al. | | 327/434 |
| 7,486,108 B2 * | 2/2009 | Kim et al. | | 326/34 |
| 7,902,914 B2 * | 3/2011 | Kawasaki | | 327/544 |
| 8,610,485 B2 * | 12/2013 | Hiyama | | 327/324 |
| 8,704,584 B2 * | 4/2014 | Shimazaki et al. | | 327/395 |
| 2002/0075049 A1 * | 6/2002 | Yokoyama et al. | | 327/170 |
| 2013/0002339 A1 * | 1/2013 | Paul et al. | | 327/427 |

FOREIGN PATENT DOCUMENTS

JP     2001037207     2/2001

OTHER PUBLICATIONS

Copy of Office Action dated Mar. 27, 2014 from corresponding application No. DE 10 2003 112 684.7.

* cited by examiner

*Primary Examiner* — Quan Tra
(74) *Attorney, Agent, or Firm* — Hauptman Ham, LLP

(57) ABSTRACT

A wake up circuit includes a bias signal control block configured to receive a sleep signal and to generate a plurality of bias control signals. The wake up circuit further includes a bias supply block configured to receive each bias control signal of the plurality of bias control signals and to generate a header bias signal. The bias supply block includes a first bias stage configured to receive a first bias control signal of the plurality of bias control signals, and to control the header bias signal to be equal to a first voltage. The bias supply block further includes a second bias stage configured to receive a second bias control signal of the plurality of bias control signals, and to control the header bias signal to be equal to a second voltage different from the first voltage. The wake up circuit further includes a header configured to receive the header bias signal, and to selectively connect a supply voltage to a load based on the header bias signal.

20 Claims, 7 Drawing Sheets

WAKE UP BIAS CIRCUIT AND METHOD OF USING THE SAME

BACKGROUND

A technique that is used to help reduce power consumption of a circuit is to operate the circuit in a sleep or hibernate mode when the circuit is not in active use. In the sleep or hibernate mode, the circuit consumes less power. As the circuit transitions from a sleep mode to a normal operating mode, an amount of power supplied to the circuit increases. A transition period between the sleep mode and the normal operating mode is called a wake up mode.

During the wake up mode, an amount of power supplied to the circuitry is gradually increased to prevent damage or improper operation of the circuit. In some approaches, a daisy chain is used to regulate the power supplied to the circuit during the wake up mode. A daisy chain is a connection design in which multiple devices are connected together to operate in a sequence thereby individually transitioning different components of the circuit to the normal operation mode.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
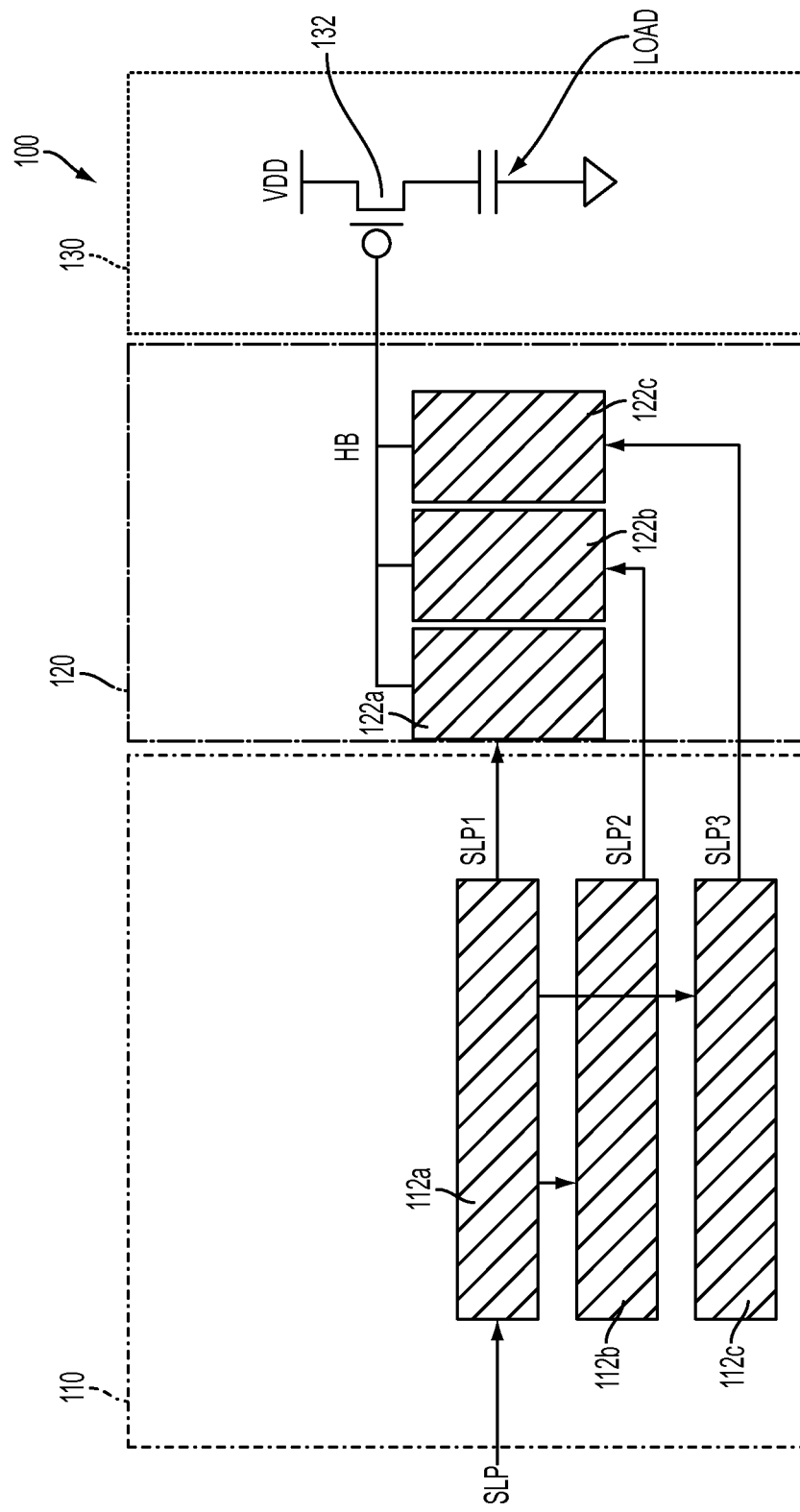
FIG. 1 is a block diagram of a wake up bias circuit in accordance with one or more embodiments.

FIG. 1 is a block diagram of a wake up bias circuit 100 in accordance with one or more embodiments. Wake up bias circuit 100 includes a bias signal control block 110 configured to receive a sleep signal SLP. Bias signal control block 110 includes a first bias signal generator 112a configured to receive sleep signal SLP. First bias signal generator 112a is configured to generate a first bias signal SLP1, a first delayed signal, and a second delayed signal. A second bias signal generator 112b is configured to receive the first delayed signal from first bias signal generator 112a. Second bias signal generator 112b is configured to generate a second bias signal SLP2. A third bias signal generator 112c is configured to receive the second delayed signal from first bias signal generator 112a. Third bias signal generator 112c is configured to generate a third bias signal SLP3. Wake up bias circuit 100 further includes a bias supply block 120 configured to receive bias signals from bias signal control block 110. Bias supply block 120 includes a first bias stage 122a configured to receive first bias signal SLP1. First bias stage 122a is configured to output a first voltage as part of a header bias signal HB. Bias supply block 120 includes a second bias stage 122b configured to receive second bias signal SLP2. Second bias stage 122b is configured to control header bias signal HB to have a second voltage. Bias supply block 120 includes a third bias stage 122c configured to receive second bias signal SLP3. Third bias stage 122c is configured to control header bias signal HB to be a third voltage. Wake up bias circuit 100 further includes a header 130. Header 130 is configured to receive header bias signal HB and selectively connect a load with a supply voltage VDD. Header 130 includes a transistor 132 configured to receive header bias signal HB and selectively connect the load to supply voltage VDD.

Bias signal control block 110 includes three separate bias signal generators 112a, 112b and 112c. In some embodiments, bias signal control block 110 includes more than three bias signal generators. First bias signal generator 112a is configured to receive sleep signal SLP. Sleep signal SLP is used to indicate whether the load is in a sleep mode or a normal operating mode. Based on a logic value of sleep signal SLP, first bias signal generator 112a is configured to generate and output first bias signal SLP1. First bias signal SLP1 is used to control first bias stage 122a. First bias signal generator 112a is also configured to generate and output the first delayed signal and the second delayed signal. The first delayed signal is used to delay a response of second bias signal generator 112b to a change in logic value of sleep signal SLP. In some embodiments, a delay time associated with the first delayed signal is less than one cycle time of wake up bias circuit 100. In some embodiments, the delay time associated with the first delayed signal is greater than or equal to one cycle time of wake up bias circuit 100. The second delayed signal is used to delay a response of third bias signal generator 112c to a change in logic value of sleep signal SLP. In some embodiments, a delay time associated with the second delayed signal is less than one cycle time of wake up bias circuit 100 following the delay time associated with the first delayed signal. In some embodiments, the delay time associated with the second delayed signal is greater than or equal to one cycle time of wake up bias circuit 100 following the delay time associated with the first delayed signal. In some embodiments, the delay time associated with the second delayed signal is twice the delay time associated with the first delayed signal. In some embodiments, the delay time associated with the second delayed signal is greater than or less than twice the delay time associated with the first delayed signal.

Second bias signal generator 112b is configured to receive the first delayed signal which is based on sleep signal SLP. A change in logic state of sleep signal SLP will result in a change in a logic state of the first delayed signal. Based on a logic value of the first delayed signal, second bias signal generator 112b is configured to generate and output second bias signal SLP2. Second bias signal SLP2 is used to control second bias stage 122b.

Third bias signal generator 112c is configured to receive the second delayed signal which is based on sleep signal SLP. A change in logic state of sleep signal SLP will result in a change in a logic state of the second delayed signal. Based on a logic value of the second delayed signal, third bias signal generator 112c is configured to generate and output third bias signal SLP3. Third bias signal SLP3 is used to control third bias stage 122c.

Bias supply block 120 is configured to receive the bias signals SLP1, SLP2 and SLP3 from bias signal control block 110 and generate header bias signal HB to control header 130. First bias stage 122a is configured to receive first bias signal SLP1. Based on a logic value of first bias signal SLP1, first bias stage 122a is configured to output the first voltage to header bias signal HB. The first voltage is not sufficient to fully turn ON transistor 132; however, the first voltage is configured to increase a conductivity of transistor 132.

Second bias stage 122b is configured to receive second bias signal SLP2. Based on a logic value of second bias signal SLP2, second bias stage 122b is configured to control header bias signal to be the second voltage. The second voltage is not sufficient to fully turn ON transistor 132; however, the second voltage is configured to increase a conductivity of transistor 132 to a level greater than the first voltage.

Third bias stage 122c is configured to receive third bias signal SLP3. Based on a logic value of third bias signal SLP3, third bias stage 122c is configured to control the header bias signal HB to be equal to the third voltage. The third voltage is sufficient to fully turn ON transistor 132. In some embodiments which include more than three bias stages, the third voltage is not sufficient to fully turn ON transistor 132, but increases the conductivity of the transistor. In some embodiments where the third voltage is insufficient to fully turn ON transistor 132; additional bias stages are used to fully turn ON the transistor.

Header 130 is configured to receive header bias signal HB and selectively connect the load to supply voltage VDD. Header 130 includes transistor 132 having a gate configured to receive header bias signal HB. A source of transistor 132 is configured to receive supply voltage VDD. A drain of transistor 132 is connected to the load. Transistor 132 is a p-type metal-oxide-semiconductor (PMOS) transistor. In some embodiments, transistor 132 is an n-type metal-oxide-semiconductor (NMOS) transistor. In some embodiments, transistor 132 is a different type of switching element such as a bipolar transistor; a high electron mobility transistor, a thyristor, a fin field effect transistor (Fin FET), or another suitable switching element.

Figure 2:
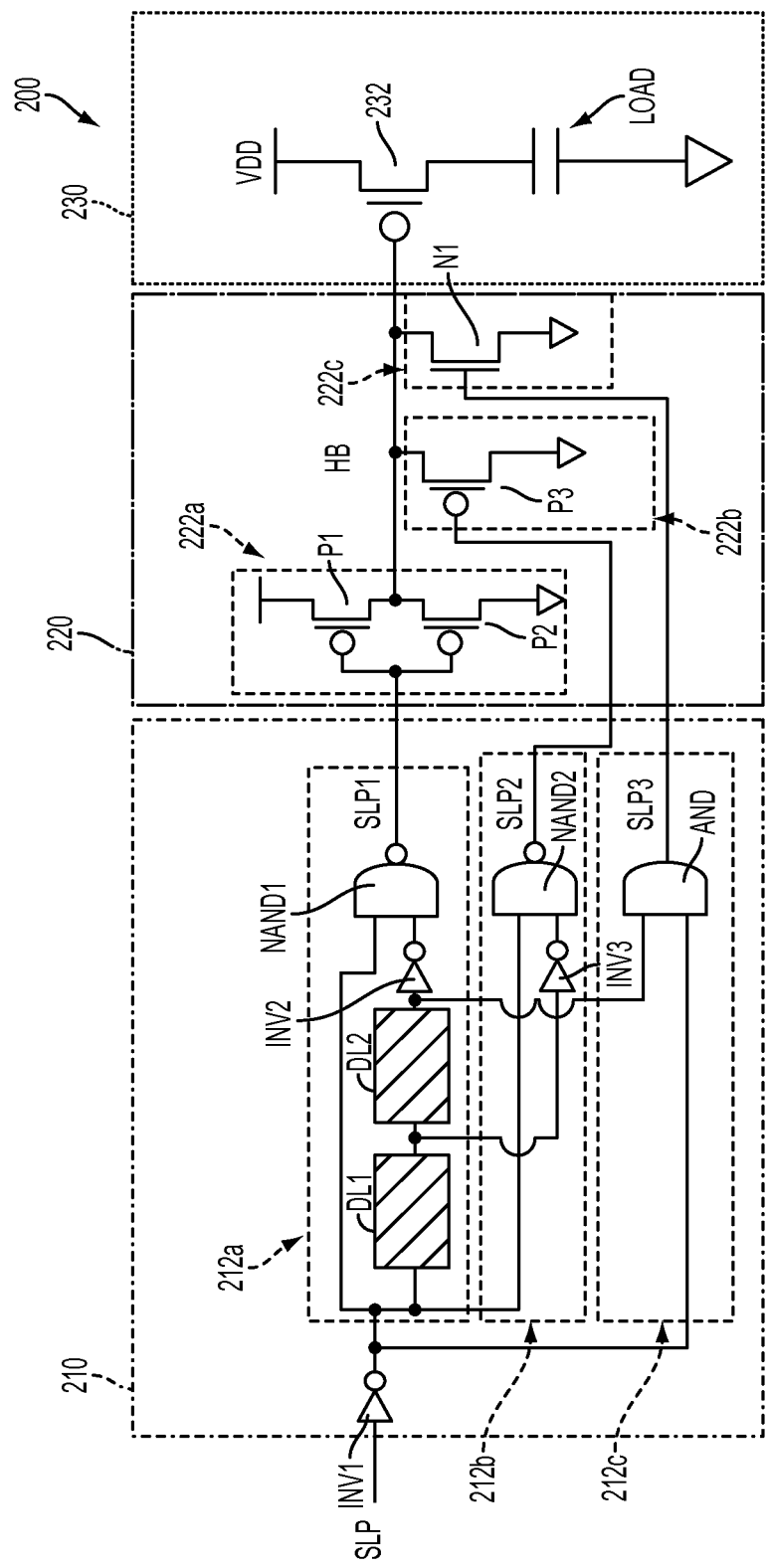
FIG. 2 is a schematic diagram of a wake up bias circuit in accordance with one or more embodiments.

FIG. 2 is a schematic diagram of a wake up bias circuit 200 in accordance with one or more embodiments. Wake up bias circuit 200 is similar to wake up bias circuit 100. Similar elements have a same reference number increased by 100. Wake up bias circuit 200 includes a bias signal control block 210 configured to receive sleep signal SLP. Bias signal control block 210 includes an inverter INV1 configured to receive sleep signal SLP. Inverter INV1 inverts the logic state of sleep signal SLP. An output of inverter INV1 is supplied to a first bias signal generator 212a, a second bias signal generator 212b and a third bias signal generator 212c.

First bias signal generator 212a includes a first delay circuit DL1 configured to receive the output from inverter INV1. First bias signal generator 212a further includes a second delay circuit DL2 configured to receive an output from first delay circuit DL1. First bias signal generator 212a further includes an inverter INV2 configured to receive an output of second delay circuit DL2. First bias signal generator 212a further includes a NAND gate NAND1 configured to receive an output of inverter INV2 and the output of inverter INV1. NAND gate NAND1 is configured to output first bias signal SLP1. In some embodiments, a delay introduced by first delay circuit DL1 is equal to a delay introduced by second delay circuit DL2. In some embodiments, the delay introduced by first delay circuit DL1 is different from the delay introduced by second delay circuit DL2. In some embodiments, a delay introduced by first delay circuit DL1 is less than one cycle of wake up bias circuit 200. In some embodiments, a delay introduced by second delay circuit DL2 is less than one cycle of wake up bias circuit 200. In some embodiments, a delay introduced by first delay circuit DL1 or second delay circuit DL2 is greater than or equal to a cycle of wake up bias circuit 200.

Second bias signal generator 212b includes an inverter INV3 configured to receive the output of first delay circuit DL1. Second bias signal generator 212b further includes a NAND gate NAND2 configured to receive an output of inverter INV3 and inverter INV1. NAND gate NAND2 is configured to output second bias signal SLP2. In some embodiments, a voltage level of first bias signal SLP1 is greater than a voltage level of second bias signal SLP2.

Third bias signal generator 212c includes an AND gate AND configured to receive the output of inverter INV1 and the output of second delay circuit DL2. AND gate AND is configured to output third bias signal SLP3.

Bias supply block 220 is configured to receive bias signals SLP1, SLP2 and SLP3 and to generate header bias signal HB. First bias stage 222a includes a voltage divider which includes a first transistor P1 and a second transistor P2. Each of first transistor P1 and second transistor P2 include a gate configured to receive first bias signal SLP1. First transistor P1 includes a source configured to receive supply voltage VDD and a drain connected to second transistor P2. Second transistor P2 includes a source connected to the drain of first transistor P1 and a drain connected to a ground voltage. First bias stage 222a is configured to output the first voltage to header bias signal HB at the drain of first transistor P1. In the embodiments of FIG. 2, first transistor P1 and second transistor P2 are p-type transistors. In some embodiments, first transistor or second transistor P2 is an n-type transistor.

Second bias stage 222b includes a third transistor P3 having a gate configured to receive second bias signal SLP2. Third transistor P3 is has a source connected to the drain of first transistor P1 and a drain connected to the ground voltage. In the embodiments of FIG. 2, third transistor P3 is a p-type transistor. In some embodiments, third transistor P3 is an n-type transistor.

Third bias stage 222c include a fourth transistor N1 having a gate configured to receive third bias signal SLP3. Fourth transistor N1 has a source connected to the ground voltage and a drain connected to the drain of first transistor P1. In the embodiments of FIG. 2, fourth transistor N1 is an n-type transistor. In some embodiments, fourth transistor N1 is a p-type transistor.

Header 230 is configured to receive header bias signal HB and selectively supply voltage VDD to the load. Transistor 232 has a gate connected to the drain of first transistor P1 and configured to receive header bias signal HB. Transistor 232 has a source configured to receive supply voltage VDD and a drain connected to the load. In the embodiments of FIG. 2, transistor 232 is a p-type transistor. In some embodiments, transistor 232 is an n-type transistor.

Figure 3A:
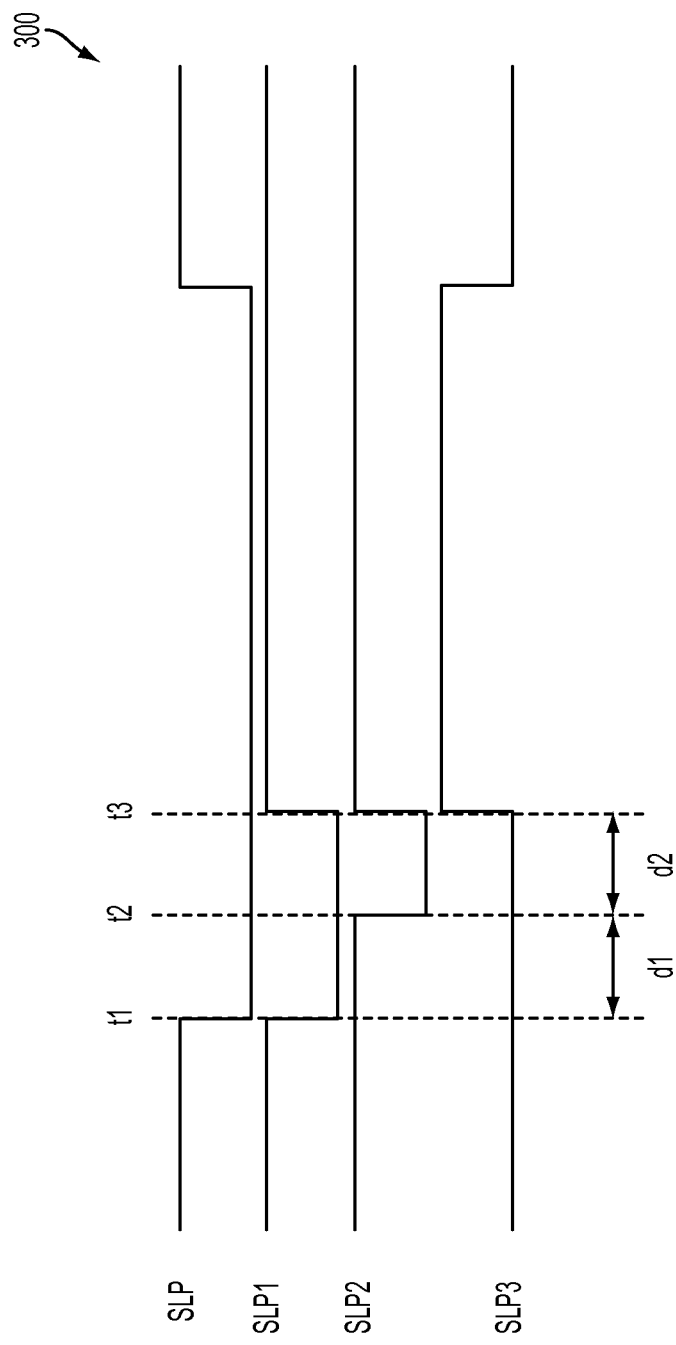
FIG. 3A is a waveform diagram of a wake up bias circuit in operation in accordance with one or more embodiments.

FIG. 3A is a waveform diagram 300 of a wake up bias circuit in operation in accordance with one or more embodiments. For illustrative purposes, waveform diagram 300 is explained with reference to wake up bias circuit 200 (FIG. 2). Sleep signal SLP is initially at a high logic state indicating that the load is in a sleep mode. The high logic value of sleep signal SLP produces a high logic value for first bias signal SLP1 and second bias signal SLP2. The high logic value of sleep signal SLP produces a low logic value for third bias signal SLP3.

First bias signal SLP1 has a high logic value because inverter INV1 outputs a low logic value to NAND gate NAND1. First delay circuit DL1, second delay circuit DL2 and inverter INV2 collectively produce a high logic value output to NAND gate NAND1. As a result, NAND gate NAND1 outputs first bias signal SLP1 at a high logic value. A high logic value first bias signal SLP1 turns OFF first transistor P1 and second transistor P2, so that the gate of transistor 232 is disconnected from supply voltage VDD and the ground voltage.

Second bias signal SLP2 has a high logic value because inverter INV1 outputs the low logic value to NAND gate NAND2 and inverter INV3 outputs a high logic value to the NAND gate. As a result, NAND gate NAND2 outputs second bias signal SLP2 at a high logic value. A high logic value second bias signal SLP2 turns OFF third transistor P3, so that the gate of transistor 232 is disconnected from the ground voltage.

Third bias signal SLP3 is a low logic value because AND gate AND receives the low logic value from inverter INV1 and the low logic value from second delay circuit DL2. As a result, AND gate AND outputs third bias signal SLP3 at a low logic value. A low logic value third bias signal SLP3 turns OFF fourth transistor N1, so that the gate of transistor 232 is disconnected from the ground voltage.

Based on the logic state of bias signals SLP1, SLP2 and SLP3, the load is disconnected from supply voltage VDD. At a time t1, sleep signal SLP transitions to a low logic state indicating the load is waking up to enter a normal operation mode. First bias signal SLP1 also transitions to a low logic value due to the change in the output of inverter INV1. The low logic value of first bias signal SLP1 activates first transistor P1 and second transistor P2. As a result, the gate of transistor 232 is connected to both supply voltage VDD and the ground voltage. Second bias signal SLP2 and third bias signal SLP3 remain unchanged at time t1.

At a time t2, second bias signal SLP2 transitions a low logic value due to a change in output of inverter INV3, but third bias signal remains unchanged. Time t2 is a duration d1 after time t1. Duration d1 is equal to a delay of first delay circuit DL1. The low logic value of second bias signal SLP2 activates third transistor P3 to connect the gate of transistor 232 to the ground voltage. The voltage at the drain of first transistor P1 now has two paths to the ground voltage, i.e., one through second transistor P2 and one through third transistor P3. The result is a decrease in a voltage level at the gate of transistor 232.

At a time t3, third bias signal SLP3 transitions a high logic value due to a change in the output of second delay circuit DL2. Also at time t3, first bias signal SLP1 and second bias signal SLP2 transition to a high logic value due to the change in the output of second delay circuit DL2. Time t3 is a duration d2 after time t2. Duration d2 is equal to a delay of second delay circuit DL2. In some embodiments, duration d1 is equal to duration d2. In some embodiments, duration d1 is different from duration d2. The high logic value of third bias signal SLP3 activates fourth transistor N1 to connect the gate of transistor 232 to the ground voltage. The high logic value of first bias signal SLP1 and second bias signal SLP2 turns OFF first transistor P1, second transistor P2 and third transistor P3. As a result, the gate of transistor 232 is disconnected from supply voltage VDD. The gate of transistor 232 is connected to the ground voltage through fourth transistor N1 which turns ON transistor 232 to connect the load to supply voltage VDD. Following time t3, the load is in the normal operation mode.

Figure 3B:
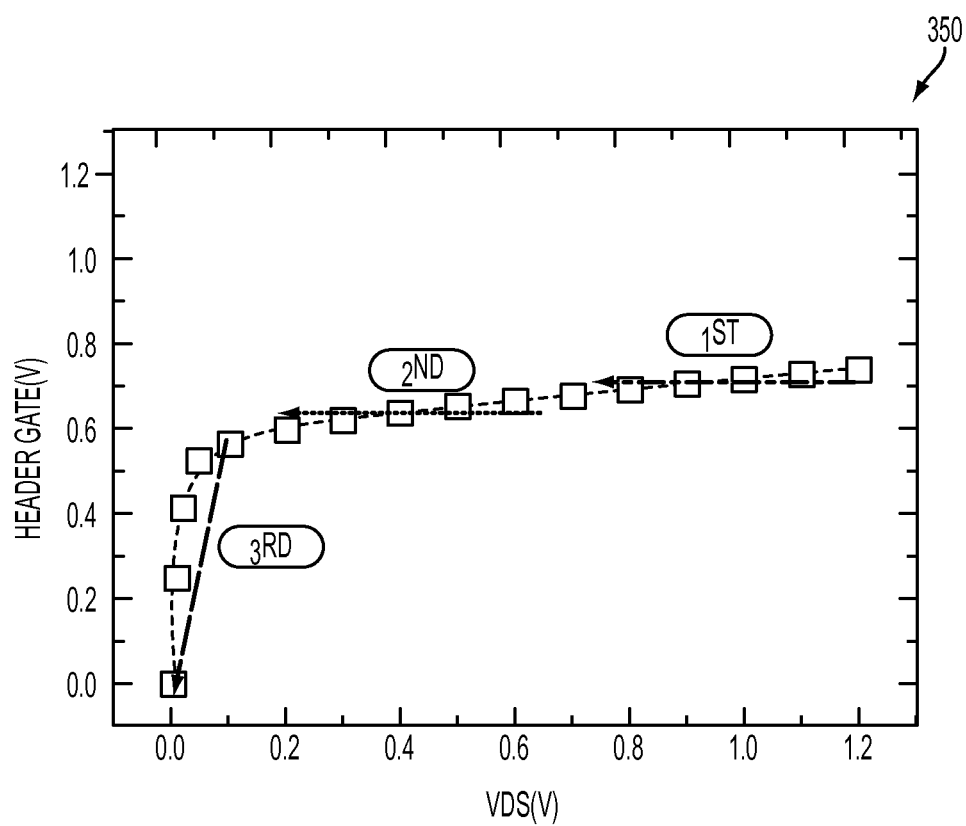
FIG. 3B is a graph of a voltage drop across a header transistor versus a voltage supplied to a gate of the header transistor in operation of a wake up bias circuit in accordance with one or more embodiments.

FIG. 3B is a graph 350 of a voltage drop across a header transistor versus a voltage supplied to a gate of the header transistor in operation of a wake up bias circuit in accordance with one or more embodiments. Graph 350 is used to illustrate operation of the header transistor during a wake up mode. Graph 350 indicates an example using an operating voltage of 1.2V. One of ordinary skill in the art would recognize that different operating voltages are within the scope of this description.

During a first time frame, e.g., from time t1 to time t2 (FIG. 3A), the voltage applied to the gate of the header transistor, e.g., transistor 232 (FIG. 2), is slightly greater than 0.6 V. The first time frame corresponds to activation of a first bias stage, e.g., first bias stage 222a. The voltage drop across the header transistor decreases from 1.2 V to about 0.8 V, i.e., the header transistor becomes more conductive.

During a second time frame, e.g., from time t2 to time t3 (FIG. 3A), the voltage applied to the gate of the header transistor, e.g., transistor 232 (FIG. 2), decreases slightly to about 0.6V. The second time frame corresponds to the activation of a second bias stage, e.g., second bias stage 222b. The voltage drop across the header transistor decreases from about 0.8V to about 0.2V, i.e., the header transistor becomes more conductive.

During a third time frame, e.g., following time t3 (FIG. 3A), the voltage applied to the gate of the header transistor, e.g., transistor 232 (FIG. 2), decreases in a substantially linear relationship with the voltage drop across the header transistor. The third time frame corresponds to the activation of a third bias stage, e.g., third bias stage 222c. The header transistor becomes conductive to connect a supply voltage to a load.

In the first time frame and the second time frame, the header transistor is operating in a saturation mode. By activating the first bias stage, a resistance of the header transistor is reduced to compensate for a current drop due to a difference between a gate voltage and a source voltage of the header transistor. By activating the second bias stage, the resistance of the header transistor is reduced to compensate for a current drop due to channel length modulation within the header transistor. The use of multiple bias stages helps to maintain a linear relationship between the voltage drop across the header transistor and the voltage applied to the gate of the header transistor. The linear relationship helps to provide a substantially constant current to the load during a wake up process, which reduces a risk of damage to the load. In comparison with a wake up circuit operating using a non-linear relationship, the linear relationship provides an increased level of predictability during the wake up mode, which facilitates a faster wake up time, so that the load is able to operate normally more quickly in response to a change in a logical state of the sleep signal.

In some embodiments, the second bias signal generator and the second bias stage are omitted. In some embodiments which omit the second bias signal generator and the second bias stage, the first bias signal generator and the first bias stage operate in the saturation mode to compensate for both the current drop due to a difference between the gate voltage and the source voltage of the header transistor as well as the channel length modulation of the header transistor. In some embodiments, the relationship between the voltage drop across the header transistor and the voltage applied to the gate is less linear in embodiments which omit the second bias signal generator and the second bias stage, but a wake up time is decreased by introducing less delay between a start of a wake up process and completion of the wake up process.

In some embodiments, more than three bias stages are used to control the header transistor. In some embodiments, any additional bias stages also operate within the saturation region of the header transistor to provide increased linearity between the voltage drop across the header transistor and the voltage applied to the gate of the header transistor.

Figure 4:
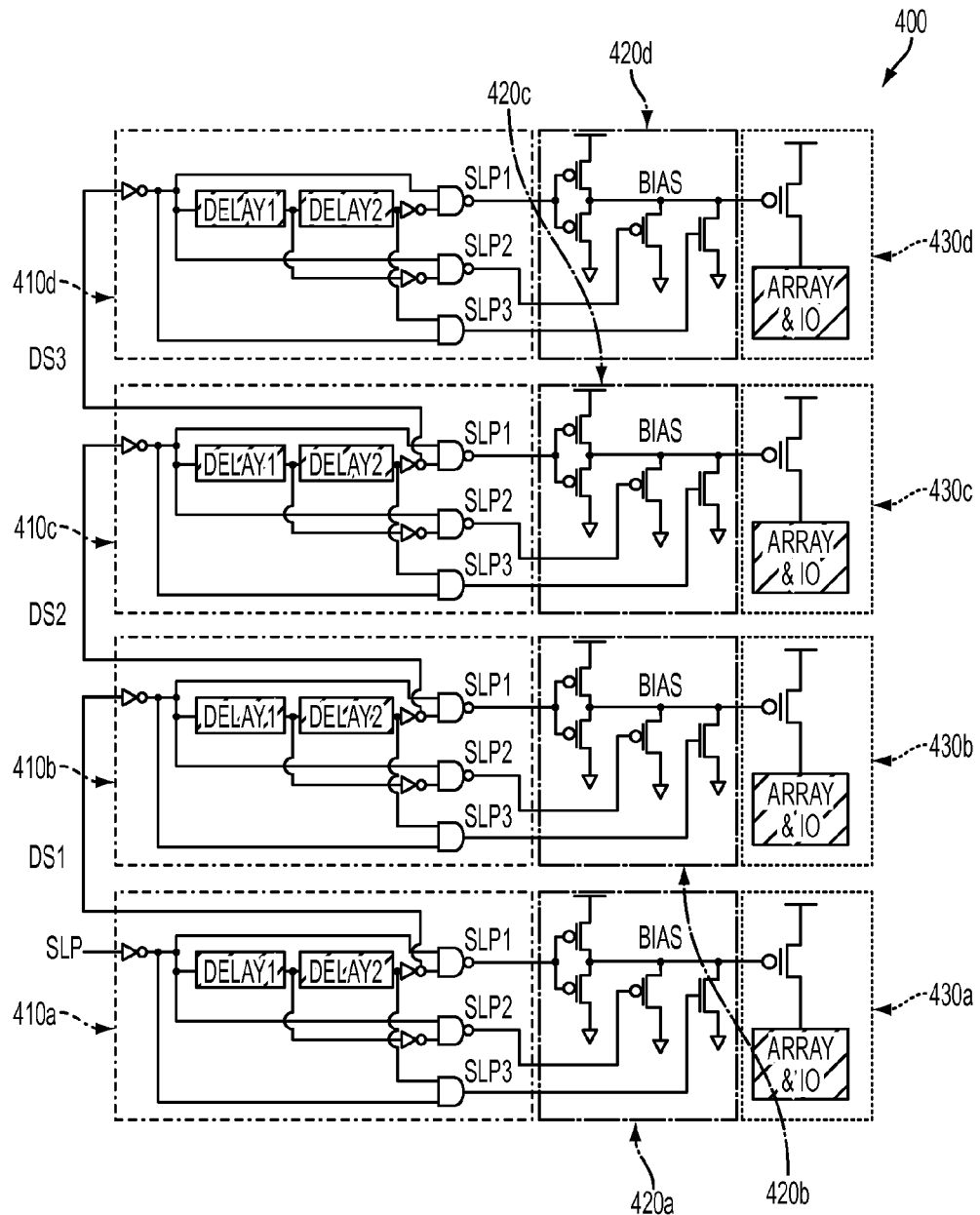
FIG. 4 is a schematic diagram of a wake up bias circuit array in accordance with one or more embodiments.

FIG. 4 is a schematic diagram of a wake up bias circuit array 400 in accordance with one or more embodiments. Each wake up bias circuit of wake up bias circuit 400 is similar to wake up bias circuit 200 (FIG. 2). Wake up bias circuit array 400 is configured to sequentially transition different loads from a sleep mode to a normal operation mode. A first wake up bias circuit includes a first bias signal control block 410a configured to generate bias signals receivable by a first bias supply block 420a. First bias supply block 420a is configured to generate a first header bias signal for controlling a first header 430a. The first wake up bias circuit is configured to receive sleep signal SPL as an input. In operation, the first wake up bias circuit operates similar to wake up bias circuit 200.

A second wake up bias circuit includes a second bias signal control block 410b configured to generate bias signals receivable by a second bias supply block 420b. Second bias supply block 420b is configured to generate a second header bias signal for controlling a second header 430b. The second wake up bias circuit is configured to receive a first delayed sleep signal DS1 as an input. First delayed sleep signal DS1 is a same logical level as sleep signal SLP delayed by a first delay circuit, e.g., first delay circuit DL1 (FIG. 2), and a second delay circuit, e.g., second delay circuit DL2, of first wake up bias circuit with respect to the sleep signal. In operation, the second wake up bias circuit operates similar to wake up bias circuit 200.

A third wake up bias circuit includes a third bias signal control block 410c configured to generate bias signals receivable by a third bias supply block 420c. Third bias supply block 420c is configured to generate a third header bias signal for controlling a third header 430c. The third wake up bias circuit is configured to receive a second delayed sleep signal DS2 as an input. Second delayed sleep signal DS2 is a same logical level as sleep signal SLP delayed by a first delay circuit, e.g., first delay circuit DL1 (FIG. 2), and a second delay circuit, e.g., second delay circuit DL2, of the second wake up bias circuit with respect to first delayed sleep signal DS1. In operation, the third wake up bias circuit operates similar to wake up bias circuit 200.

A fourth wake up bias circuit includes a fourth bias signal control block 410d configured to generate bias signals receivable by a fourth bias supply block 420d. Fourth bias supply block 420d is configured to generate a fourth header bias signal for controlling a fourth header 430d. The fourth wake up bias circuit is configured to receive a third delayed sleep signal DS3 as an input. Third delayed sleep signal DS3 is a same logical level as sleep signal SLP delayed by a first delay circuit, e.g., first delay circuit DL1 (FIG. 2), and a second delay circuit, e.g., second delay circuit DL2, of the third wake up bias circuit with respect to second delayed sleep signal DS2. In operation, the fourth wake up bias circuit operates similar to wake up bias circuit 200.

In operation, loads connected to headers 430a, 430b, 430c and 430d reach the normal operating mode in order based on the delay of an input of the corresponding wake up bias circuit. In some embodiments, more or less than four wake up bias circuits are connected together.

Figure 5:
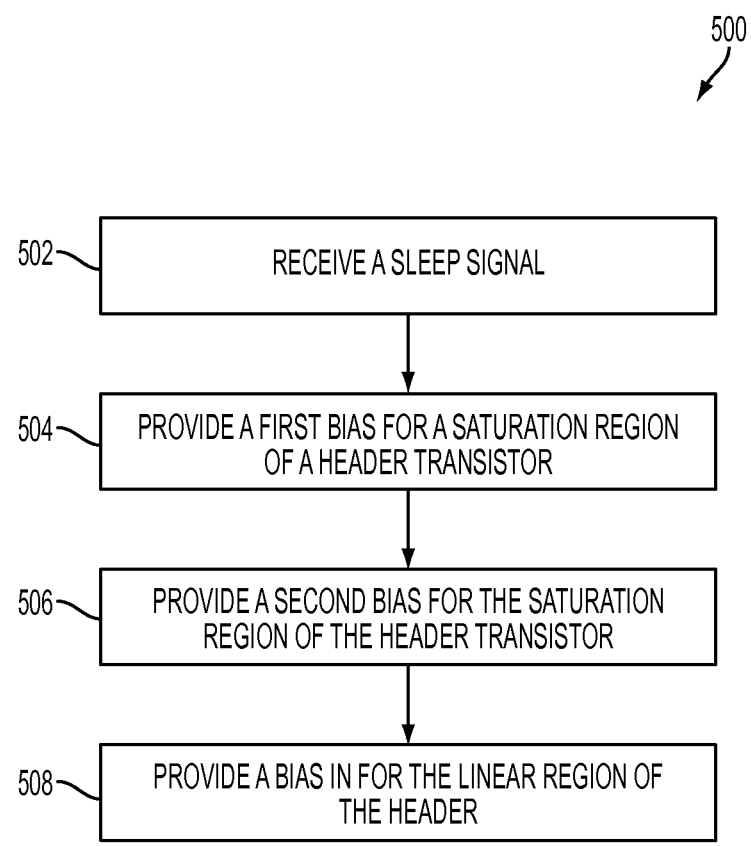
FIG. 5 is a flow chart of a method of using a wake up bias circuit in accordance with one or more embodiments.

FIG. 5 is a flow chart of a method 500 of using a wake up bias circuit in accordance with one or more embodiments. Method 500 begins with receiving a sleep signal, e.g., sleep signal SLP (FIG. 2). The sleep signal is generated based on an operating state of a load connected to the wake up bias circuit.

Method 500 continues with operation 504, in which a first bias for a saturation region of a header transistor is provided to a gate of the header transistor. In some embodiments, the first bias is provided based on a first bias signal generated by a first bias signal generator, e.g., first bias signal generator 212a (FIG. 2). The first bias signal is received by a first bias stage, e.g., first bias stage 222a, to provide the first bias to the header transistor, e.g., transistor 232. In some embodiments, the first bias is used to compensate for a current drop due to a difference between a gate voltage and a source voltage of the header transistor.

Method 500 continues with operation 506, in which a second bias for the saturation region of the header transistor is provided to the gate of the header transistor. In some embodiments, the second bias is provided based on a second bias signal generated by a second bias signal generator, e.g., second bias signal generator 212b (FIG. 2). The second bias signal is received by a second bias stage, e.g., second bias stage 222b, to provide the second bias to the header transistor, e.g., transistor 232. In some embodiments, the second bias is used to compensate for a current drop due to channel length modulation within the header transistor.

Method 500 continues with operation 508, in which a bias for a linear region of the header transistor is provided to the gate of the header transistor. In some embodiments, the bias is provided based on a third bias signal generated by a third bias signal generator, e.g., third bias signal generator 212c (FIG. 2). The third bias signal is received by a third bias stage, e.g., third bias stage 222c, to provide the third bias to the header transistor, e.g., transistor 232. In some embodiments, the bias is used to turn ON the header transistor.

One of ordinary skill in the art would recognize that method 500 contains additional steps, such as providing additional biases for the saturation region of the header transistor, in some embodiments.

Figure 6:
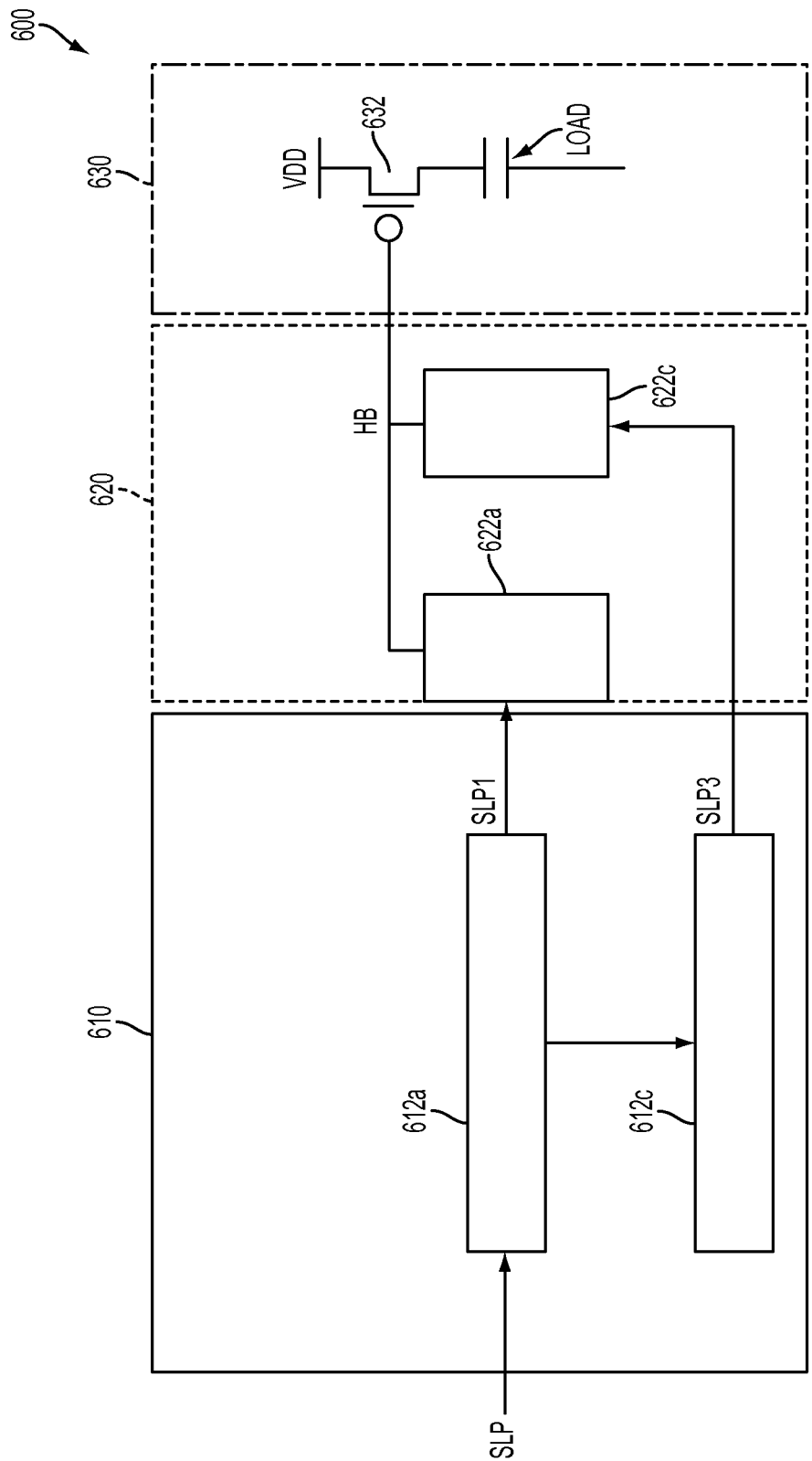
FIG. 6 is a block diagram of a wake up bias circuit in accordance with one or more embodiments.

FIG. 6 is a block diagram of a wake up bias circuit 600 in accordance with one or more embodiments. Wake up bias circuit 600 is similar to wake up bias circuit 100 (FIG. 1), similar elements have a same reference number increased by 500. In comparison with wake up bias circuit 100, wake up bias circuit 600 includes two bias signal generators 612a and 612c and two bias stages 622a and 622c. Second bias signal generator 112b (FIG. 1) and second bias stage 122b are omitted from wake up bias circuit 600.

One aspect of this description relates to a wake up bias circuit. The wake up circuit includes a bias signal control block configured to receive a sleep signal and to generate a plurality of bias control signals. The wake up circuit further includes a bias supply block configured to receive each bias control signal of the plurality of bias control signals and to generate a header bias signal. The bias supply block includes a first bias stage configured to receive a first bias control signal of the plurality of bias control signals, and to control the header bias signal to be equal to a first voltage. The bias supply block further includes a second bias stage configured to receive a second bias control signal of the plurality of bias control signals, and to control the header bias signal to be equal to a second voltage different from the first voltage. The wake up circuit further includes a header configured to receive the header bias signal, and to selectively connect a supply voltage to a load based on the header bias signal.

Another aspect of this description relates to a wake up bias circuit. The wake up circuit includes a bias signal control block. The bias signal control block includes a first bias signal generator configured to receive a sleep signal and to output a first bias control signal. The bias signal control block further includes a second bias signal generator configured to receive a first delayed signal and to generate a second bias control signal, wherein the first delayed signal is delayed by a first duration with respect to the sleep signal. The bias signal control block further includes a third bias signal generator configured to receive a second delayed signal and to generate a third bias control signal, wherein the second delayed signal is delayed by a second duration with respect to the first delayed signal. The wake up circuit further includes a bias supply block configured to receive to receive the first bias control signal, the second bias control signal and the third bias control signal, and to generate a header bias signal. The wake up circuit further includes a header configured to receive the header bias signal, and to selectively connect a supply voltage to a load based on the header bias signal.

Still another aspect of this description relates to a method of using a wake up bias circuit. The method includes receiving a sleep signal, generating a plurality of bias control signals using a bias signal control block and controlling a header bias based on each bias control signal of the plurality of bias control signals using a bias supply block. Controlling the header bias includes controlling the header bias to be equal to a first voltage using a first bias stage receiving a first bias control signal of the plurality of bias control signals. Controlling the header bias further includes controlling the header bias to be equal to a second voltage different from the first voltage using a second bias stage receiving a second bias control signal of the plurality of bias control signals. The method further includes selectively connecting a supply voltage to a load based on the header bias using a header.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A wake up bias circuit comprising:
   a bias signal control block configured to receive a sleep signal and to generate a plurality of bias control signals;
   a bias supply block configured to receive each bias control signal of the plurality of bias control signals and to generate a header bias signal, the bias supply block comprising:
   a first bias stage configured to receive a first bias control signal of the plurality of bias control signals, and to control the header bias signal to be equal to a first voltage,
   a second bias stage configured to receive a second bias control signal of the plurality of bias control signals, and to control the header bias signal to be equal to a second voltage different from the first voltage, wherein the second bias stage comprises a transistor having a first type, and
   a third bias stage configured to receive a third bias control signal of the plurality of bias control signals, and to control the header bias signal to be equal to a third voltage different from the first voltage and from the second voltage, wherein the third bias stage comprises a transistor having a second type opposite the first type; and
   a header configured to receive the header bias signal, and to selectively connect a supply voltage to a load based on the header bias signal.

2. The wake up bias circuit of claim 1, wherein the bias signal control block comprises:
   a first bias signal generator configured to receive the sleep signal, and to output the first bias control signal of the plurality of bias control signals; and
   a second bias signal generator configured to output the second bias control signal of the plurality of bias control signals.

3. The wake up circuit of claim 2, wherein the first bias signal generator is configure to output a first delayed signal, wherein the first delayed signal is delayed by a first duration with respect to the sleep signal, and
   the second bias signal generator is configured to receive the first delayed signal.

4. The wake up circuit of claim 3, wherein the bias signal control block further comprises a third bias signal generator, the first bias signal generator is configure to output a second delayed signal, the second delayed signal is delayed by a second duration with respect to the first delayed signal,
   the third bias signal generator is configured to receive the second delayed signal, and
   the first duration is equal to the second duration.

5. The wake up circuit of claim 1, wherein the first voltage is greater than the second voltage.

6. The wake up circuit of claim 1, wherein the header comprises a header transistor having a gate configured to receive the header bias signal.

7. A wake up bias circuit comprising:
   a bias signal control block, the bias signal control block comprising:
   a first bias signal generator configured to receive a sleep signal and to output a first bias control signal and a first delayed signal,
   a second bias signal generator configured to receive the first delayed signal and to generate a second bias control signal, wherein the first delayed signal is delayed by a first duration with respect to the sleep signal, and
   a third bias signal generator configured to receive a second delayed signal and to generate a third bias control signal, wherein the second delayed signal is delayed by a second duration with respect to the first delayed signal;
   a bias supply block configured to receive the first bias control signal, the second bias control signal and the third bias control signal, and to generate a header bias signal; and
   a header configured to receive the header bias signal, and to selectively connect a supply voltage to a load based on the header bias signal.

8. The wake up circuit of claim 7, wherein the first bias signal generator comprises:
   a first delay circuit configured to receive an inverted sleep signal and to output the first delayed signal;
   a second delay circuit configured to receive the first delayed signal and to output the second delayed signal;
   an inverter configured to receive the second delayed signal and to output a first inverter signal; and
   a NAND gate configured to receive the inverted sleep signal and the first inverter signal, and to output the first bias control signal.

9. The wake up circuit of claim 7, wherein the second bias signal generator comprises:
an inverter configured to receive the first delayed signal and to output a second inverter signal; and
a NAND gate configured to receive an inverted sleep signal and the second inverter signal, and to output the second bias control signal.

10. The wake up circuit of claim 7, wherein the third bias signal generator comprises an AND gate configured to receive the second delayed signal and an inverted sleep signal, and to output the third bias control signal.

11. The wake up circuit of claim 7, wherein the bias supply block comprises:
a first bias stage configured to receive the first bias control signal, and to control the header bias signal to be equal to a first voltage,
a second bias stage configured to receive the second bias control signal, and to control the header bias signal to be equal to a second voltage different from the first voltage, and
a third bias stage configured to receive the third bias control signal, and to control the header bias signal to be equal to a third voltage different from the first voltage and the second voltage.

12. The wake up circuit of claim 11, wherein the first bias stage comprises:
a first transistor having a first gate configured to receive the first bias control signal, a first terminal configured to receive the supply voltage; and
a second transistor having a second gate configured to receive the first bias control signal, a first terminal configured to receive a ground voltage, wherein a second terminal of the first transistor is connected to a second terminal of the second transistor.

13. The wake up circuit of claim 12, wherein the second bias stage comprises a third transistor having a gate configured to receive the second bias control signal, a first terminal configured to receive the ground voltage and a second terminal connected to the second terminal of the first transistor.

14. The wake up circuit of claim 12, wherein the third bias stage comprises a fourth transistor having a gate configured to receive the third bias control signal, a first terminal configured to receive the ground voltage and a second terminal connected to the second terminal of the first transistor.

15. The wake up circuit of claim 12, wherein the header comprises a header transistor having a gate connected to the second terminal of the first transistor, a first terminal configured to receive the supply voltage and a second terminal connected to the load.

16. A method of using a wake up bias circuit, the method comprising:
receiving a sleep signal;
generating a plurality of bias control signals using a bias signal control block;
generating a first delayed signal using a first bias signal generator;
controlling a header bias based on each bias control signal of the plurality of bias control signals using a bias supply block, wherein controlling the header bias comprises:
controlling the header bias to be equal to a first voltage using a first bias stage receiving a first bias control signal of the plurality of bias control signals,
controlling the header bias to be equal to a second voltage different from the first voltage using a second bias stage receiving a second bias control signal of the plurality of bias control signals, and
controlling the header bias to be equal to a third voltage using a third bias stage receiving a third bias control signal of the plurality of bias control signals, the third voltage being between the first and second voltages; and
selectively connecting a supply voltage to a load based on the header bias using a header.

17. The method of claim 16, wherein generating a plurality of bias control signals comprises:
generating the first bias control signal of the plurality of bias control signals using the first bias signal generator receiving the sleep signal; and
generating the second bias control signal of the plurality of bias control signals using a second bias signal generator.

18. The method of claim 17,
wherein the first delayed signal is delayed by a first duration with respect to the sleep signal; and
generating the second bias control signal based on the first delayed signal.

19. The method of claim 18, wherein controlling the header to be equal to the third voltage comprises:
generating the third bias control signal of the plurality of bias control signals using a third bias signal generator;
generating a second delayed signal using the first bias signal generator, wherein the second delayed signal is delayed by a second duration with respect to the sleep signal; and
generating the third bias control signal based on the second delayed signal,
wherein generating the second delayed signal comprises generating the second delayed signal so the second duration is less than the first duration.

20. The method of claim 16, wherein selectively connecting the supply voltage to the load comprises turning ON a header transistor having a gate receiving the header bias signal.

* * * * *